United States Patent [19]

Foster et al.

[11] Patent Number: 5,882,836
[45] Date of Patent: *Mar. 16, 1999

[54] PHOTOCURABLE FORMULATION CONTAINING A PARTIALLY POLYMERIZED DIVINYLSILOXANE LINKED BISBENZOCYCLOBUTENE RESIN

[75] Inventors: Pamela S. Foster; Ernest L. Ecker; Edward W. Rutter, Jr.; Eric S. Moyer, all of Midland, Mich.

[73] Assignee: The Dow Chemical Company, Midland, Mich.

[ * ] Notice: This patent issued on a continued prosecution application filed under 37 CFR 1.53(d), and is subject to the twenty year patent term provisions of 35 U.S.C. 154(a)(2).

[21] Appl. No.: 465,664

[22] Filed: Jun. 5, 1995

Related U.S. Application Data

[60] Division of Ser. No. 224,203, Apr. 14, 1994, which is a continuation-in-part of Ser. No. 54,999, Apr. 29, 1993.

[51] Int. Cl.⁶ .................. G03C 1/52; C08C 2/48
[52] U.S. Cl. .................. 430/194; 430/286.1; 430/287.1; 522/65; 522/99
[58] Field of Search .................. 430/286, 287, 430/286.1, 287.1, 194; 522/99, 65

[56] References Cited

U.S. PATENT DOCUMENTS

| | | | |
|---|---|---|---|
| 2,852,379 | 9/1958 | Hepher et al. | 430/197 |
| 3,075,950 | 1/1963 | Newland et al. | 260/66 |
| 3,625,919 | 12/1971 | Kamogawa et al. | 526/75 |
| 3,948,667 | 4/1976 | Ichikawa et al. | 430/196 |
| 4,197,133 | 4/1980 | Zweifel et al. | 430/195 |
| 4,354,976 | 10/1982 | Romer et la. | 260/349 |
| 4,469,778 | 9/1984 | Iwayanagi et al. | 430/325 |
| 4,525,523 | 6/1985 | Nakamura et al. | 524/572 |
| 4,540,763 | 9/1985 | Kirchhoff | 526/281 |
| 4,571,375 | 2/1986 | Benedikt | 430/197 |
| 4,642,329 | 2/1987 | Kirchoff et al. | 526/284 |
| 4,783,514 | 11/1988 | Kirchoff et al. | 526/281 |
| 4,812,588 | 3/1989 | Schrock | 556/453 |
| 5,002,808 | 3/1991 | Hahn et al. | 427/387 |
| 5,416,233 | 5/1995 | DeVries et al. | 556/479 |

FOREIGN PATENT DOCUMENTS

| | | | |
|---|---|---|---|
| 0119719 | 9/1984 | European Pat. Off. | G03C 1/68 |
| 0140319 | 5/1985 | European Pat. Off. | G03F 7/10 |
| 0334381 | 9/1989 | European Pat. Off. | G03F 7/08 |
| 93/12055 | 6/1993 | WIPO . | |

OTHER PUBLICATIONS

Kilb, Journal of Physical Chemistry, 62, 1958, pp. 969–971, Dilute Celling System I. The Effect of Ring Formation on Gelation.
Price et al., Journal of Physical Chemistry, 62, 1958, pp. 972–978, Dilute Celling Systems II. Polyesters.
Price, Journal of Physical Chemistry, 62, 1958, pp. 977–978, Dilute Celling Systems III. Polyakoxysilanes.
Zimm et al., Journal of Physical Chemistry, 62, 1958, p. 979. Dilute Celling Systems IV Divinylbenzene–Styrene Compositions.
Specht et al., Tetahedron, vol. 38, No. 9, pp. 1203–1211 (1982), Ketocomarins A new class of Triplet Sensitizers.
Harris, Journal of Chemical Physics, vol. 23, No. 8, pp. 1518–1525 (Aug. 1955) Ring Formation and Molecular Weight Distributions in Branched Chain Polymers I.
Hoeve, Journal of Polymer Science, vol. XXI, pp. 11–18 (1956), Molecular Weight Distributing of Thermally Polymerized Triglyceride Oils Effect of Intermolecular Reaction.
Johnson et al., IEEE Transactions on Components, Hybrids and Manufacturing Technology, vol. 13, No. 2, Jun. 1990, pp. 347–352, Benzocyclobutene Interlayer Dielectrics for Thin Film Multichip Modules.
Radik et al., "MCM–D Technology For a Communication Application," 1994 ICEMM, Denver, CO, Apr. 13–15, 1994.
Research Disclosure No. 339, Jul. 1992, Article No. 33987, "Low Stress Curing of DVS", pp. 585, 586, entire article.
Shimoto et al., "CU/Photosensitive/BCB Thin Film Multilayer Technology for High Performance Multichip Modules," 1994 ICEMM, Denver, Co, Apr. 13–15, 1994.
Photodefinable Benzocyclobutene Formulations for Thin Film Microelectronic Applications. III. 1 to 20 Microns Patterned Films. Moyer et al. 1993.
Photodefinable Benzocyclobutene Formulations for Thin Film Microelectronic Applications: Part II. Moyer et al., 9 Sep. 1992.
A Photo definable Benzocyclobutene Resin for Thin Film Microelectronic Applications, Rutter et al. Apr. 1992.
A Photodefinable Benzocyclobutene Resin for Thin Film Microelectronic Applications, Takahashi et al. Jun. 1992.

*Primary Examiner*—Bernard Codd

[57] ABSTRACT

A photocurable formulation containing a partially polymerized DVS resin formed by heating DVS monomer (1,3-bis(2-bicyclo[4.2.0]octa-1,3,5-trien-3-ylethenyl)-1,1,3,3-tetramethyldisiloxane) in a solvent at an initial concentration of DVS monomer in the solvent of from about 12 to about 32 weight percent. This photocurable formulation may be used as an interlayer dielectric to fabricate thin film multichip modules.

6 Claims, No Drawings

PHOTOCURABLE FORMULATION CONTAINING A PARTIALLY POLYMERIZED DIVINYLSILOXANE LINKED BISBENZOCYCLOBUTENE RESIN

RELATED APPLICATIONS

This is a divisional of application Ser. No. 08/224,203 filed Apr. 14, 1994 which is a continuation-in-part of copending application Ser. No. 054,999, filed Apr. 29, 1993.

BACKGROUND OF THE INVENTION

This invention relates to partially polymerized resins and processes for preparing them.

Such polymers may be rendered photocurable and may be used in passivation films, photoresists, as insulating layers in fabricating electrical devices, as protective films for semiconductor elements and as interlayer dielectrics in multichip modules and other multilayer electronic circuits.

Johnson et al. disclose in *IEEE Transactions On Components, Hybrids, and Manufacturing Technology*, Vol. 13, No. 2, June, 1990, that a polymer of

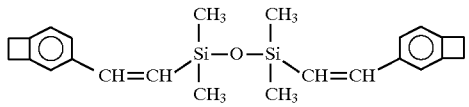

1,3-bis(2-bicyclo[4.2.0]octa-1,3,5-trien-3-ylethenyl)-1,1,3,3-tetramethyldisiloxane (hereinafter DVS monomer), now available as a partially polymerized (B-staged) solution in mesitylene from The Dow Chemical Company as CYCLOTENE® 3022 (hereinafter a partially thermally polymerized DVS monomer or DVS resin) may be used as an interlayer dielectric to fabricate thin film multichip modules. The partially thermally polymerized DVS monomer may be applied by spin-coating a solution of the DVS resin onto a substrate, allowing the solvent to evaporate and then polymerizing by heating to about 250° C. for about five minutes in nitrogen. Catalysts and/or initiators are not required for the polymerization.

U.S. patent application Ser. No. 805,395, filed Dec. 10, 1991; PCT Application No. 92/10,649, filed Dec. 10, 1992 and published as 93/12,055, Jun. 24, 1993; Moyer et al. Proceedings, IEPS, Austin, 1992, p. 37 and Rutter et al. Proceedings, ISHM/IEPS, Denver, April 1992, p. 394 disclose a DVS resin that is rendered photocurable by the addition of at least one photosensitive agent in an amount sufficient to convert the mixture to an organic-insoluble solid upon exposing the mixture to photon radiation.

In a preferred embodiment a neat B-staged DVS resin is mixed with a solvent to precipitate higher molecular weight oligomers which are then used as the photocurable resin. The removal of the monomer, dimer and lower molecular weight oligomers facilitates the photocuring of the resin.

Solvent precipitation of the resin has its drawbacks. A large portion of the DVS resin is rejected by the process. Recycling this portion increases the complexity of the process. Also the solvent used for precipitation differs from the solvent in which the finished resin is dissolved for use. Accordingly, the precipitation solvent must be removed and then the solid resin dissolved again in the use solvent, both for the useful higher molecular weight resin and the recycled low molecular weight resin.

U.S. Pat. No. 4,642,329 discloses methods for partially polymerizing or B-staging benzocyclobutene monomers. Among the ways taught is to solution polymerize the benzocyclobutene in high boiling dipolar aprotic solvents such as amides and sulfones. Lithium salts may be added to solubilize the benzocyclobutene.

This technique has its drawbacks. The partially polymerized monomer must be separated from the high boiling solvent, keeping in mind that distillation would involve temperatures that would further polymerize the benzocyclobutene. Also the use of lithium salts would leave residues of lithium which would be unacceptable if the cured resin were to be used as a dielectric in microelectronics.

It would be desirable to prepare a DVS resin with a low level of low molecular weight oligomers (e.g. monomer, dimer and trimer etc.) in a process which does not yield by-products, does not require the use of additional solvents and can be commercially scaled up.

SUMMARY OF THE INVENTION

In one aspect the invention is a process for forming a DVS resin comprising heating DVS monomer in a solvent at a concentration of DVS monomer in the solvent such that at an Mw of at least 100,000, the resin is not gelled and the radius of gyration at an absolute molecular weight of 160,000 is less than 90 Angstroms sing SEC/LALLS. Mw is the apparent weight average molecular weight by SEC based on a polystyrene calibration standard.

In another aspect the invention is a process for forming a DVS resin comprising heating DVS monomer in a solvent at a concentration of DVS monomer in the solvent such that, if the solvent stripped DVS resin is subsequently further cured at 190° C., rate of increase of the shear storage modulus G' from just beyond gelation is measured, then the exponent describing this rate of increase of G' as a function of change in fractional conversion is 400 or less.

In another aspect the invention is a process for forming a DVS resin comprising heating DVS monomer in a solvent at a concentration of DVS monomer in the solvent such that:

(a) the DVS resin, when applied and polymerized in a thin layer on a solid substrate does not craze; and (b) the DVS resin, is rendered photocurable by the addition of at least one photosensitive agent in an amount sufficient to convert the mixture to an organic-insoluble solid upon exposing the mixture to photon radiation and the film retention upon development with a solvent is at least 50 percent.

Organic-soluble means the portion of the photocurable DVS resin not exposed to photons is soluble in hydrocarbons such as Stoddard solvent, xylene, mesitylene, toluene, 2-methoxyethyl ether (diglyme), N-methyl pyrrolidone (NMP), mixtures of NMP and 2-hydroxyethyl 2-pyrrolidone, dipropylene glycol dimethyl ether (available as Proglyde™ DMM solvent from The Dow Chemical Company), a Stoddard/methanol mixture, ethyl lactate, n-butyl butyrate, ethyl butyrate and other butyric esters, or mixtures thereof.

These three methods of describing the process and the DVS resin are understood to generally describe the same process and DVS resin, though there may be variations in the scope with each description.

In another aspect the invention is the DVS resin formed by said process.

In another aspect the invention is a DVS resin wherein the radius of gyration at an absolute molecular weight of 160,000 is less than 90 Angstroms using SEC/LALLS.

In another aspect the invention is a DVS resin wherein if the DVS resin is solvent stripped and subsequently further cured at 190° C., and the rate of increase of the shear storage modulus G' from just beyond gelation is measured, then the exponent describing this rate of increase of G' as a function of change in fractional conversion is 400 or less.

In another aspect the invention is a photocurable formulation containing said DVS resin or the DVS resin formed by said process.

In another aspect the invention is a cured polymer of said DVS resin or the DVS resin formed by said process.

In another aspect the invention is a substrate containing at least one patterned layer of a cured polymer of said DVS resin or the DVS resin formed by said process.

A feature of the invention is that the polymerization takes place in the presence of a solvent wherein the initial concentration of DVS monomer is within a specific range.

An advantage of the invention is that the process may be more readily scaled up to a commercial scale, may generate little or no low molecular weight fraction that must be separated from a precipitating solvent and make a DVS resin which may be used to form a film on a substrate which retains its integrity.

DETAILED DESCRIPTION OF THE INVENTION

The DVS monomers of this invention include compounds of the structure:

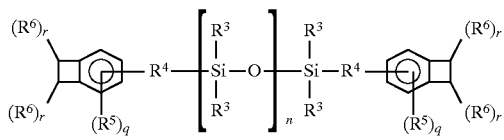

wherein
each $R^3$ is independently $C_{1-6}$ alkyl, cycloalkyl, aralkyl, or phenyl;
each $R^4$ is independently ethenyl, propenyl or 2-methyl propenyl;
each $R^5$ is independently $C_{1-6}$ alkyl, trimethylsilyl, methoxy, or chloro;
each $R^6$ is independently $C_{1-6}$ alkyl, chloro, or cyano;
n is an integer of 1 or more; and
each q and r is independently an integer of zero or 1.

The most preferred DVS compound is represented by the formula:

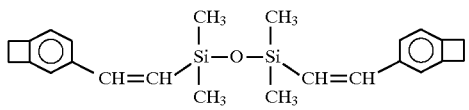

The depictions of this compound herein should not be construed to define any particular geometric isomer or spatial orientation about the ethenylene double bonds. Compositions made by the processes disclosed herein contain positional isomers about these double bonds as well as other compounds.

These organopolysiloxane-bridged bisbenzocyclobutene monomers can be prepared by methods disclosed in U.S. Pat. Nos. 4,812,588; 5,136,069; 5,138,081; and 5,264,646.

Following one of the disclosed procedures for making the preferred DVS monomer, one will obtain a mixture containing as a major component divinyltetramethyldisiloxane-bis-benzocyclobutene monomer. This monomer mixture has a low viscosity. According to the process of the invention this DVS monomer may be partially polymerized in contact with a solvent.

One polymerizes the monomer under conditions that yield a partially polymerized resin that will yield acceptable performance when used as a photocurable resin in thin films. Acceptable performance includes retention of integrity such as absence of crazing. It also includes adequate film retention upon curing. Crazing is the formation of fractures or wrinkling in the thin film of DVS resin as it is coated onto a substrate, as it is prebaked prior to photocuring or when it is exposed to a development solvent. The fractures and wrinkling result in nonuniform thickness of the resin film. Film retention is the ratio of the thickness of the finally developed and cured film to the thickness of the initial film after solvent evaporation and being spun on, usually designated in percent.

One may test the performance properties of the resin of the invention by formulating the resin into a photocurable resin by, for example, adding about three weight percent 2,6-bis(4-azidobenzylidene)-4-methylcyclohexanone (BAC-M). The formulation is coated onto a substrate such as by spin or spray coating, any solvent is removed, a photon source is used to cure at least a portion of the resin formulation beyond its gel point, a solvent is used to remove unexposed portions of the resin formulation and the photocured resin is finally cured, for example, with heat.

The resin is acceptable if the film does not craze prior to photocuring and the film retention is adequate. Preferably, the film retention is adequate if the development solvent does not remove the photocured film and the ratio of the thickness of the finally cured film to the thickness of the film prior to solvent development is at least about 0.50 or there is at least about 50 percent film retention.

One may achieve acceptable resins, preferably, by controlling the initial concentration of monomer in the solvent in the partial polymerization process. Preferably, the initial concentration is between 12 and 32 weight percent monomer based on the total weight of monomer and solvent. If the initial concentration is less than about 12 weight percent, the film formed from the partially polymerized resin has a tendency to craze upon evaporation of the solvent, upon solvent development of the film or during plasma cleaning of the cured film. If the initial concentration of the monomer is more than about 32 weight percent, film retentions tend to be less than 50 percent.

Preferably, the film retention is at least about sixty percent and more preferably the film retention is at least 75 percent. Most preferably, the film retention is at least about 90 percent.

The more preferable film properties may be obtained by using preferred initial DVS monomer concentrations. Preferably, the initial DVS monomer concentration is from about seventeen percent to about 30 percent. More preferably, the initial DVS monomer concentration is from about 20 to about 25 percent. Most preferably, the initial DVS monomer concentration is 25 percent plus or minus 1 percent. The effect of initial DVS monomer concentration, while a critical parameter is not a step function. The changes in the final film properties are a smooth function of the initial monomer concentration under identical photo processing conditions.

One may carry out the partial polymerization process in a solvent that dissolves both the DVS monomer and the partially polymerized DVS resin at the reaction or polymerization temperature or one may carry out the partial polymerization process in a solvent that dissolves the DVS monomer but not the desired partially polymerized DVS resin at the reaction or polymerization temperature. Suitable solvents depend on which process one wishes to use.

Solvents which dissolve the partially polymerized DVS resin are hydrocarbons and the like. Aliphatic hydrocarbons such as hexane, Isopar G®, Stoddard solvent and the like; aromatic hydrocarbons such as toluene, xylenes and mesitylene are exemplary. More preferred solvents include aromatic hydrocarbons such as toluene, xylenes and mesitylene. Mesitylene is most preferred because it is also the formulation solvent. Another more preferred group is hydrocarbons which have normal boiling points at or below 165° C., so that the solvent may be easily removed from the resin by distillation and replaced by the formulation solvent.

Solvent from which the partially polymerized DVS resin will precipitate include alcohols. $C_3$–$C_6$ alcohols are preferred with t-amyl alcohol and n-butanol being most preferred.

Preferably, the solvent and DVS monomer are free of ions which would effect the dielectric properties of the final fully cured film. Exemplary ions excluded are metal ions such as alkali metal and transition metal ions, and anions such as halides, sulfates and nitrates.

One may carry out the partial polymerization at a temperature that is effective to polymerize the DVS monomer. Suitable temperatures include from about 125° C. to about 300° C. Preferred temperatures include from about 140° C. to about 250° C. More preferred temperatures include from about 140° C. to about 200° C. If the polymerization temperature is higher than the boiling point of the solvent a pressure vessel may be used. At lower temperatures, the polymerization proceeds more slowly. At higher temperatures the degree of polymerization is more difficult to control.

One may carry out the partial polymerization for a time determined to provide a partially polymerized resin that provides the desired finally cured film properties. One may carry out the polymerization for a period of time sufficient to obtain an Mw of from about 20,000 to about 170,000. Preferably, one may carry out the polymerization for a period of time sufficient to obtain an Mw of from about 90,000 to about 170,000. Most preferably, one polymerizes the DVS monomer to obtain a DVS resin with an Mw of 140,000 plus or minus 10,000 g/mol.

Mw is the weight average molecular weight. Mn is the number average molecular weight. The ratio, Mw/Mn, is called the polydispersity of the resin. Molecular weights described in this application are apparent molecular weights. They are determined by size exclusion chromatography (SEC) using narrow molecular weight range linear atactic polystyrene polymers as standards. The polymers made in the processes described herein contain a relatively wider molecular weight range. Also, the monomer is tetrafunctional and may give rise to branched polymers.

The initial concentration of monomer affects the rate of reaction. The higher the initial concentration of monomer, the less time it takes to achieve a given Mw.

Preferably, one should not polymerize the DVS resin beyond its gel point. Beyond its gel point, the resin is insoluble in aromatic solvents such as mesitylene. Time varies depending on the polymerization temperature. The higher the temperature, the less time is needed to obtain a given molecular weight.

Preferably, oxygen is excluded from the polymerization reaction. A concentration of less than 100 ppm oxygen in the atmosphere in contact with the reaction is suggested.

When the partial polymerization process of the invention is completed, the partially polymerized DVS resin of the invention is obtained. It is believed that the DVS resin of the invention differs from the DVS resin formed by partially polymerizing the DVS monomer neat and precipitating the desired resin in an alcoholic solvent. The resin partially polymerized in a solvent appears to have a smaller hydrodynamic volume for a given absolute molecular weight. This may be due to a higher probability that active sites from the same molecule will find each other when diluted by a solvent. The lower the initial concentration of monomer, the more pronounced this affect appears to be.

In order to directly probe structural differences, size exclusion chromatography coupled to low angle laser light scattering (SEC/LALLS) is used. One can determine the radius of gyration Rg at a given molecular weight of various types of DVS resins. It is found that DVS resins prepared by solvent B-staging at initial DVS monomer concentrations of less than 30 percent have a lower Rg for a given absolute molecular weight than similar resins prepared by neat B-staging. At an absolute molecular weight of 160,000, a neat B-staged DVS resin has an Rg of 90 Angstroms or above. At an absolute molecular weight of 160,000, a DVS resin B-staged at an initial concentration of less than 30 percent DVS monomer has an Rg of less than 90 Angstroms. A suitable method for measuring Rg is set out in the examples.

Another difference between a DVS resin B-staged in a solvent at less than 30 percent initial DVS monomer concentration and a DVS resin formed by partially polymerizing the DVS monomer neat and precipitating the desired resin in an alcoholic solvent is the cure behavior in the rubbery state just after gellation and before vitrification. G' or the shear storage modulus increases more rapidly for the neat B-staged DVS resin at equivalent cure conditions. The rate of increase in G' during the rubbery phase may be measured in a parallel plate rheometer. At a cure temperature of 190° C. and in the rubbery phase just beyond gelation, G' increases exponentially. The rate constant describing this exponential increase in G' is 0.011 $\sec^{-1}$ or greater for neat B-staged DVS resins whereas it is 0.009 $\sec^{-1}$ or less for DVS resins B-staged at an initial concentration of 30 percent or less DVS monomer. A suitable method for measuring G' is set out in the examples.

The partially polymerized DVS resin of the invention, formed by the process of the invention, may be incorporated into a photocurable formulation. Said formulation may include one or more photosensitive agents, one or more photosensitizers, and other adjuvants such as antioxidants, fillers, adhesion agents, dyes, other monomers or oligomers, polymerization accelerators or retarders and the like.

Suitable agents to render the DVS resin of the invention photocurable and processes for photocuring said resin are disclosed in U.S. patent application Ser. No. 805,395 filed Dec. 10, 1991; PCT Application No. 92/10,649, filed Dec. 10, 1992; Moyer et al. Proceedings, IEPS, Austin, 1992, p. 37; Rutter et al. Proceedings, ISHM/IEPS, Denver, April 1992, p. 394; and Moyer et al. Proceedings, MRS, Boston, 1993 which are incorporated herein by reference.

Suitable photosensitive agents employable to make the resin of the invention photocurable are those which have an absorption maximum near the wavelengths of the photon source being used and affect benzocyclobutene photocuring. When a photosensitizer is used in conjunction with a photosensitive agent, suitable photosensitive agents are those capable of accepting energy from the photosensitizer.

Preferred photosensitive agents include azides, bismaleimides, acrylates, acetylenes, isocyanates, conjugated aromatic ketones, and benzophenone-containing polymers.

The most preferred group of photosensitive agents is the azides. The azides employed in preparing the polymers of this invention correspond to the formula $$Q-(N_3)_x$$

wherein

Q is an x-valent organic moiety, and x is an integer of 2 or more.

Examples of suitable azides, as well as their synthesis and properties are described in "Azides and Nitrenes, Reactivity and Utility," Academic Press, 1984; "Azides and Amines from Grignard Reagents and Tosyl Azide" Smith et al., J. Org. Chem., 34, 3430, (1969); "Encyclopedia of Polymer Science and Engineering," 2nd Edition, Volume 11, 186–212; Yang et al., Proc. SPIE-Int. Soc. Opt. Eng., 469 (Adv. Resist Technol.), 117–26, 1984; Wolf et al., J. Electrochem. Soc., 131(7), 1664–70, 1984; Tsunoda et al., Photographic Science and Engineering, 17, 390, (1973); Journal of Photographic Science, 29, 188, (1976); "Organic Compounds with Nitrogen-Nitrogen Bonds" Ronald Prez Co., New York, N.Y., 1966; Boyer et al., Chem. Rev., 54, 1, (1954); Japanese Patent Number J01279240-A; U.S. Pat. Nos. 4,565,767; 4,294,908; 4,354,976; and European Patent Applications 90300546.0, 84112698.0, 84300837.6, 83810156.6, which are herein incorporated by reference.

Preferred azides are aromatic bisazides some examples of which are represented by the following formulae:

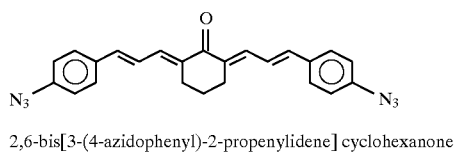

2,6-bis[3-(4-azidophenyl)-2-propenylidene] cyclohexanone

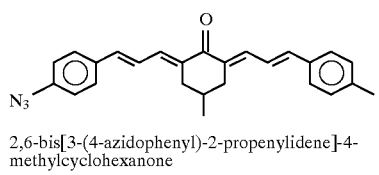

2,6-bis[3-(4-azidophenyl)-2-propenylidene]-4-methylcyclohexanone

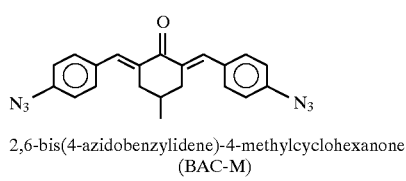

2,6-bis(4-azidobenzylidene)-4-methylcyclohexanone (BAC-M)

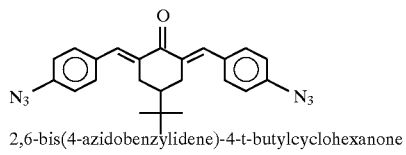

2,6-bis(4-azidobenzylidene)-4-t-butylcyclohexanone

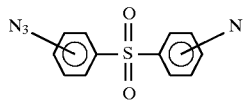

4,4' or 3,3'-diazidophenyl sulfone

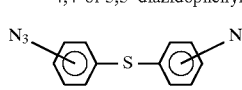

4,4' or 3,3'-diazidophenyl sulfide

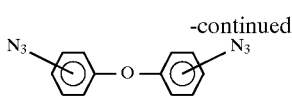

4,4' or 3,3'-diazidophenyl Ether

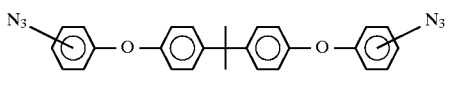

2,2-bis[4-(4-azidophenoxy) phenyl] propane
or
2,2-bis[4-(3-azidophenoxy) phenyl] propane

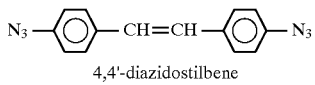

4,4'-diazidostilbene

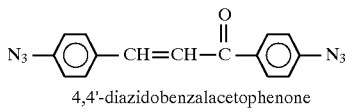

4,4'-diazidobenzalacetophenone

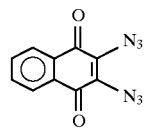

2,3-diazido-1,4-naphthoquinone

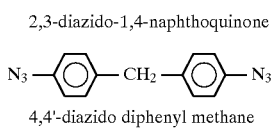

4,4'-diazido diphenyl methane

More preferred azides are highly conjugated aromatic bisazides such as BAC-M or 2,6-bis[3-(4-azidophenyl)-2-propenylidene]-4-methylcyclohexanone.

The most preferred azide is determined by the wavelengths of the photon source employed. One chooses an azide which has an absorption maximum near the wavelengths of the photon source being used, or if a photosensitizer is being used in conjunction with the photosensitive agent one chooses an azide that will accept energy from the photosensitizer. Solubility of the azide in the system being used is also a consideration. A suitable photosensitive agent for the DVS resin of the invention is a 2,6-bis(4-azidobenzylidene)-4-alkylcyclohexanone such as 2,6-bis(4-azidobenzylidene)-4-methylcyclohexanone (hereinafter, BAC-M) or 2,6-Bis(4-azidobenzylidene)-4-t-butylcyclohexanone.

Another factor bearing on the choice of a bis azide is the thickness of the layer of DVS resin to be laid down. BAC-M absorbs light at 365 nm. BAC-M is a good choice for thin layers such as 5 microns or less. In thicker layers such as 10 microns, one may wish to use BAC-M in conjunction with another bis azide that does not absorb at such a wavelength. Preferred second bis azides include 4,4' or 3,3'-diazidophenyl sulfone, 4,4' or 3,3'-diazidophenyl ether, 2,2-bis[4-(4-azidophenoxy) phenyl] propane or 2,2-bis[4-(3-azidophenoxy) phenyl] propane. More preferred bis azides for use in conjunction with BAC-M are 3,3'-diazidophenyl sulfone, 4,4'-diazidophenyl ether or 2,2-bis[4-(4-azidophenoxy) phenyl] propane. Most preferred is 3,3'-diazidophenyl sulfone.

One may wish to use these other bis azides, without BAC-M for layers thicker than 12 microns. Preferred other bis azides include 3,3'-diazidophenyl sulfone, 4,4' or 3,3'-diazidophenyl ether, 2,2-bis[4-(4-azidophenoxy) phenyl] propane or 2,2-bis[4-(3-azidophenoxy) phenyl] propane.

More preferred bis azides are 3,3'-diazidophenyl sulfone, 4,4'-diazidophenyl ether or 2,2-bis[4-(4-azidophenoxy) phenyl] propane. Most preferred is 3,3'-diazidophenyl sulfone.

The DVS resin formulation of the invention may be photocured to provide the photocured DVS polymer of the invention.

The amounts of DVS resin and photosensitive agent employed in preparing the photocured polymers of this invention can vary. Suitable amounts are those which contain DVS resin as the major component and provide a photocurable mixture from which photocured organic-insoluble polymers can be prepared by exposure to photons.

A suitable amount of photosensitive agent is that which provides sufficient curing in the photon-exposed portion of the formulation to render it insoluble in the developing solvent. A preferred weight percent (hereinafter wt %) range of photosensitive agent (BAC-M) is about 0.1 to 20 based on the sum of the weights of the individual photosensitive agents and the DVS resin. A more preferred wt % range of photosensitive agent is about 1 to 6. The most preferred wt % range of photosensitive agent is about 1 to 4. A preferred weight percent range of the DVS resin is about 80 to 99.9 based on the sum of the weights of the photosensitive agent and the DVS resin. A more preferred wt % range of the DVS resin is about 94 to 99. The most preferred wt % range of the DVS resin is about 96 to 99. For photosensitive agents which differ significantly in molecular weight from the BAC-M, one may adjust the percent of photosensitive agent to correspond to the molar concentration given by the hereinbefore stated weight percentages of the BAC-M.

In addition to the DVS resin and a photosensitive agent, some embodiments of this invention contain one or more optional components which may be added to tailor the invention's characteristics.

An antioxidant may be added to increase the formulation's oxidative stability during processing as well as in the cured resin. Antioxidants of the phenol-, sulfide-, phosphite-, and amine-type may be employed in this invention. Hindered amines are the preferred antioxidants. Hindered amines with aliphatic and aromatic moieties are more preferred antioxidants. The most preferred antioxidant is polymerized 1,2-dihydro-2,2,4-trimethylquinoline, CAS registry number 26780-96-1.

This antioxidant is available as an oligomer of the formula

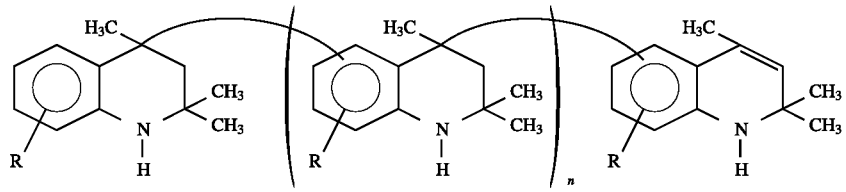

wherein R is hydrogen, an electron withdrawing or electron donating group and n is 0–6. Preferably R is hydrogen, but it also can be any substituent that does not interfere with the antioxidant activity of the compound.

2,2,4-trimethyl-1,2-dihydroquinoline, wherein R is hydrogen, is available as AgeRite® MA from R. T. Vanderbilt as an oligomer with a degree of polymerization of about 3 or 4 (n is about 1 or 2).

Preferably, the optional antioxidant is employed at a wt % range of less than 8, more preferably at a wt % range of less than 7, and most preferably at 0.001 to 6 wt %.

A photosensitizer may be added to increase the photosensitive agent's photosensitivity. The synthesis and properties of suitable optional sensitizers are disclosed in Specht et al., Tetrahedron, Vol. 38, No. 9, pp. 1203–1211, (1982); Tsunoda et al., Photographic Science and Engineering, 17, 390, (1973); U.S. Pat. No. 4,268,603; and European Patent Application 90300546.0, which are herein incorporated by reference. Suitable photosensitizers are those whose absorption maximum is near the wavelengths of the photon source employed.

Preferred photosensitizers are represented by the following formulae:

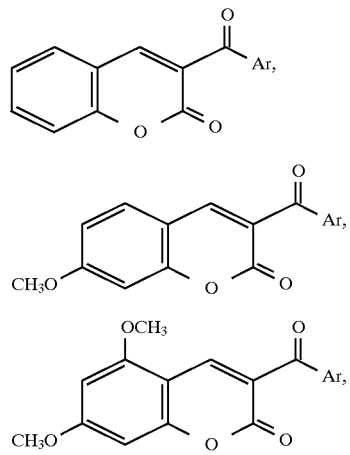

where Ar is represented by the following formulae:

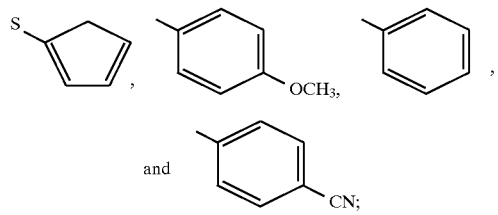

-continued

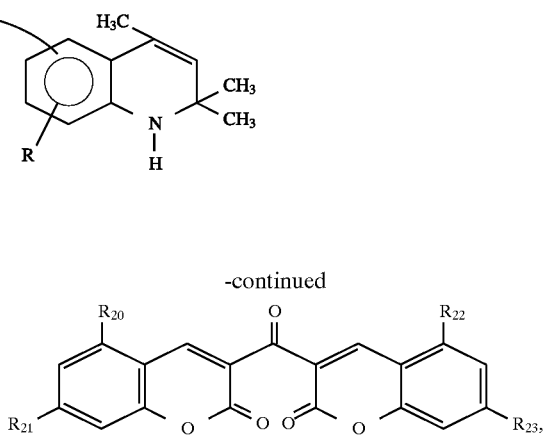

where $R^{20}$, $R^{21}$, $R^{22}$, $R^{23}$ are separately and independently H, $OCH_3$, and $—N(C_2H_5)_2$;

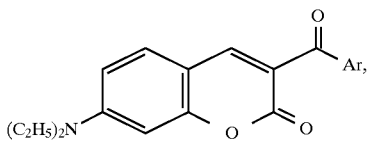

where Ar is represented by the following formulae:

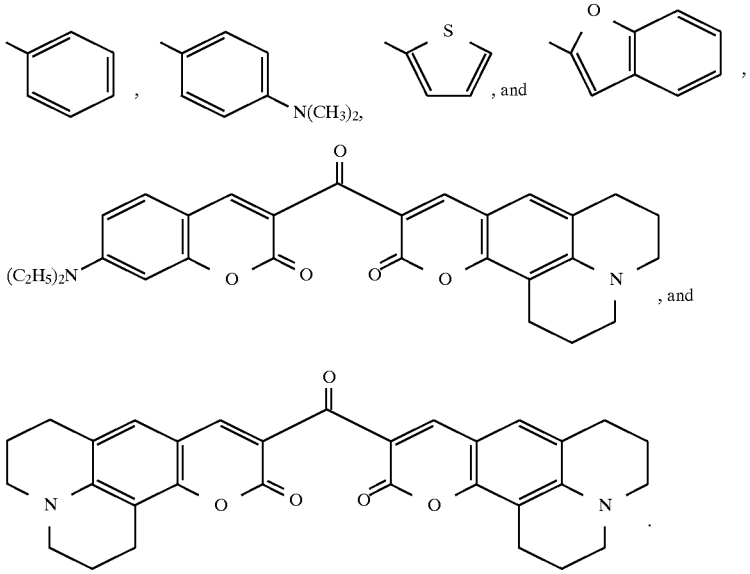

More preferred photosensitizers are represented by the following formulae:

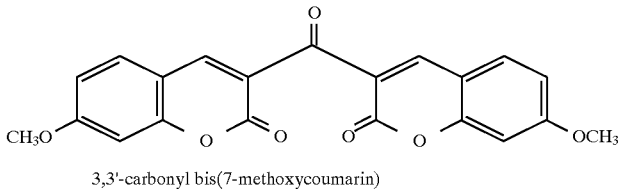

3,3'-carbonyl bis(7-methoxycoumarin)

and

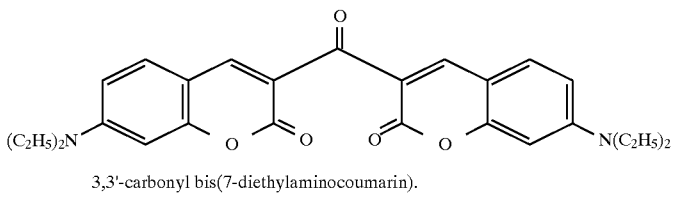

3,3'-carbonyl bis(7-diethylaminocoumarin).

In some applications, the photosensitive agent may act as a photosensitizer. For example, BAC-M may act as a photosensitizer for the diazido-sulfones and diazido-sulfides.

Preferably, the optional photosensitizer is employed at a wt % range of less than 5, more preferably at a wt % range of less than 3, and most preferably at 0.001 to 2 wt %.

The photosensitive agent can be dissolved in the partially polymerized DVS resin/solvent system by conventional means such as agitation, sonication and heating. All manipulations of the DVS resin/photosensitive agent mixture are preferably performed in a darkened environment to prevent premature initiation of the photosensitive reaction by photon radiation. One means of providing a suitable environment is by using working space equipped with amber filtered (yellow) lights which filter out wavelengths of less than 500 nm.

Thin films of the DVS resin-containing formulation may be applied to substrates without the use of an adhesion promoter. When desirable, an optional adhesion promoter is formulated as a spray- or spin-on solution which is applied immediately before applying the DVS resin-containing formulation. Alternatively, the adhesion promoter is added to the DVS resin/photo-crosslinking agent formulation.

The adhesion promoter is designed such that one end of the molecule either covalently attaches or adsorbs to the metal, metal oxide, or ceramic substrate surface, while the second end of the molecule reacts with the DVS resin polymer matrix. Suitable adhesion promoters include trialkoxyvinylsilanes and trialkoxyvinylsilyl benzocyclobutanes. The preparation and properties of trialkoxyvinylsilyl benzocyclobutanes are described in U.S. Pat. Nos. 4,831,172 and 5,002,808, which are incorporated herein by reference.

More preferred adhesion promoters include 3-aminopropyl triethoxysilane, trimethoxyvinylsilane, triethoxyvinylsilane, trimethoxyvinylsilyl benzo cyclobutanes, and triethoxyvinylsilyl benzocyclobutanes. The most preferred adhesion promoter is 3-methacryloxypropyl trimethoxysilane (CAS-02530-85-0).

Suitable substrates are comprised of silicon, alumina, ceramic materials such as aluminum nitride, glasses, cofired ceramics, copper sheet, printed circuit boards, polycrystalline diamond films, GaAs i.e., XIII–XV semiconductors, silicon nitride films, glass ceramic and high temperature polymer films such as polyimides and polybenzazoles. More preferred substrates are comprised of alumina and silicon. The most preferred substrate is silicon.

The DVS resin-containing formulations are applied from solutions containing 3–70 wt % solids. The solids content and molecular weight of the DVS resin-containing formulation determine the viscosity of the spray- or spin-on solution. Spin time and speed are used to control film quality and thickness at a particular formulation viscosity. Details of substrate coating with benzocyclobutane films can be found in the *Journal of Electronic Materials*, Vol. 19, No. 12, 1990, which is incorporated herein by reference.

In a preferred process wherein the DVS resin formulation has a viscosity of 1100±50 cSt at 25° C., one may spin-coat the DVS resin formulation at 68°–70° F. at a relative humidity of 45–55 percent with a spread of ten seconds at 500 rpm and a spin of 30 seconds at 2800 rpm. This generally yields a coating of 10–12 microns thick. A stream of xylene may be directed at the back of the substrate being coated to avoid dried resin (cotton candy) from adhering to the edges of the substrate.

The majority of the casting solvent is removed during the spin-coating process. A softbake cycle may be required to remove residual solvent. The softbake also relaxes stress resulting from the flow of the polymer film, increases the film's adhesion to the substrate, and hardens the film for more convenient handling during processing; for example, to prevent adhesion to a mask when printing in a hard contact mode.

The softbake may be performed in a convection oven, belt oven or on a hot plate. A preferred softbake temperature is one sufficient to remove residual solvent, provide stress relaxation which requires a temperature above the polymer's glass transition temperature, but low enough to avoid oxidizing or thermal curing of the resin and which allows the resin to flow sufficiently to promote planarization. The preferred softbake temperature will vary depending in part on the components of the DVS resin-containing formulation. A more preferred softbake temperature ranges from 70° C. to 120° C. The most preferred softbake temperature is 75° C. The softbake is time temperature dependent. The higher the temperature, the less time is needed to softbake. One minute on a hot plate at 120° C. may achieve the same result as 20–30 minutes in an oven at 80° C. When using BAC-M it is preferred to softbake at 75° C. for 20 minutes because of its thermal instability.

A preferred softbake time is one sufficient to remove residual solvent, provide stress relaxation, but short enough to avoid oxidizing or thermal curing of the resin components. The preferred softbake time will vary depending in part on the components of the DVS resin-containing formulation. A more preferred softbake time ranges from 15 seconds to 60 minutes. The most preferred softbake time range depends on balancing desired performance results with maximizing throughput, may vary from 15 seconds to 30 minutes. To maximize throughput, the minimum time would be optimal.

Suitable softbake atmospheres include a vacuum, air, nitrogen, argon, and helium. Nitrogen is the most preferred atmosphere.

Exposure time is dependent upon the photon source being used. Selective removal of various components of a high pressure mercury photon source may provide superior film performance. Suitable photon sources include those for which a suitable photosensitive agent exists that can absorb that photon source's wavelengths of energy. Preferred photon sources include visible light, ultraviolet light, X-rays, and electron beams. More preferred photon sources include ultraviolet and visible light. The most preferred photon source is a super high pressure mercury arc. The dose varies depending on the film thickness and the type of photsensitive agent used. For a 10 micron thick film, suitable dose at the I-line (365 nm) is 300–600 mJ/cm$^2$.

One may pattern the light striking the DVS resin formulation film by passing it through a mask in projection, proximity or soft contact mode in a conventional manner.

Following photon exposure, a softbake cycle may be employed. This cycle increases the reaction rate of long-lived photochemically generated intermediates. These intermediates have increased mobility during this cycle and thus may migrate and find a reactant species.

An alternative means of increasing the mobility of these reactive intermediates is heating during photon exposure. Such a procedure may increase the photosensitive agent's sensitivity.

Once photon exposure is complete, the film is solvent developed. Solvent development comprises removing, using a solubilizing solvent, the material that has not been exposed to photon radiation and thus not photocured. Dissolution involves two steps. The first is solvent penetration which converts the glassy polymer to a swollen network. The second step involves extracting low molecular weight oligomers from the gel at the solution interface.

Suitable developing solvents are those which selectively dissolve the nonphoton-exposed film component while minimizing swelling of the photon exposed film. Suitable solvents for unexposed DVS resin films include hydrocarbons such as Stoddard solvent, xylene, mesitylene and toluene, 2-methoxyethyl ether (diglyme), $C_5$–$C_{12}$ butyric esters such as ethyl butyrate and n-butyl butyrate, dipropylene glycol dimethyl ether (Proglyde DMM solvent), N-methyl pyrrolidone (NMP), mixtures of NMP and 2-hydroxyethyl 2-pyrollidone and a Stoddard/methanol mixture. Stoddard solvent as used herein is defined at page 1095, "Hawley's Condensed Chemical Dictionary," 11th Edition, Van Nostrand Reinhold Company, New York, 1987.

The most preferred solvents for DVS resin film systems are Stoddard solvent and Proglyde™ DMM dipropylene glycol dimethyl ether. Stoddard solvent gives better film retentions but is slow to dissolve the unexposed DVS resin and has a low flash point. Proglyde™ DMM dipropylene glycol dimethyl ether gives lower film retentions but has a higher flash point and may be less toxic than, for example, diglyme. N-butyl butyrate is a good choice for films less than 8 microns thick, but tends to cause crazing in thicker films. The choice of development solvent will to some extent be governed by the users choices between these attributes.

Preferred solvent development methods include spray, puddle or immersion techniques. Spray development is a preferred technique due to its amenability to large scale production. One preferred technique is puddling solvent on the wafer, allowing it to penetrate for a period of time which can be determined by experiment. Then the wafer is spun at a high speed to remove the solvent and penetrated film. Preferred development methods may depend on the solvent. Diglyme is preferably puddled.

For the preferred formulation for a 10 micron thick film, one may puddle Stoddard's solvent at 68° F. for 2 minutes and then rinse for 20 seconds while spinning at 500 rpm.

One may use the preferred DVS resin made from DVS monomer made using the exemplified monomer synthesis method, which is then solvent B-staged using the exemplified procedure, with an initial concentration of 25 percent solids, to achieve an Mw of from about 140,000 to about 150,000. One may make coatings on the order of 5 to 7 microns thick using such a resin formulated with 3 wt % BAC-M and 1 percent AgeRite® MA based on the DVS resin. This is then diluted with additional mesitylene to a viscosity of 350±17 cSt at 25° C. (about 40 percent DVS resin). One may make coatings on the order of 8 to 10 microns thick using such a resin formulated with 2 wt % BAC-M, 0.75 wt % 3,3'-diazidophenyl sulfone and 0.75 wt % AgeRite® MA based on the DVS resin. This is then brought to a viscosity of 1100±50 cSt at 25° C. with mesitylene (about 47 percent DVS resin). One may make coatings on the order of 20 microns or more thick using such a resin formulated with 1 wt % BAC-M, 0.9 wt % 3,3'-diazidophenyl sulfone and either 0.75 or 1 wt % AgeRite® MA.

To make 20 plus micron thick films, the spin speed must be lowered to, for example, 850 rpm for low viscosity solutions or one may increase the viscosity and spin at higher speeds. In any of these options, portions of the resin are photocured with 365 nm wavelength light for 600–1000 mJ/cm$^2$. A Proglyde™ DMM development solvent is puddled on the wafer for at least 90 seconds before being spun off. For the 5 micron coating, either Stoddard solvent or n-butyl butyrate is an effective solvent. For the 10 and 20 micron coatings, Stoddard solvent is preferred.

The solvent developed film may be post-baked to remove solvent. The post-bake may include elevation of the temperature to 120° C. to 140° C. for 0.5 to 2 minutes. Preferably, the 10 micron film may be post-baked on a hot plate in air at 100° C. for 1 minute.

One may optically inspect the device before any additional curing is carried out. DVS resins fluoresce at near UV wavelengths. This property may be used advantageously for optical inspection.

Fluorescent optical inspection may be carried out by illuminating a part with a specific wavelength of light and inspecting the part at a different wavelength. The illuminating wavelength is filtered from the light reflected to the detector. A simplified embodiment comprises a mercury lamp which illuminates the part at a near UV wavelength. The reflected light is detected with a stereoscope and a camera. The part is placed in the field of view of the stereoscope and the part is illuminated with the lamp from the side. The crown glass optics of the stereoscope filter out the reflected UV light from the lamp, but allow the longer wavelength fluorescent light from the part to be observed. The camera may be used to register the reflected light.

One may use conventional commercially available optical inspection devices for such optical inspection. Typically these devices use a bright line source, a broad band pass filter and some form of machine vision. The source of illumination may be a laser or atomic line emission source. The use of a line source eliminates the need to prefilter the light to get only the wavelength of interest. The emission filter system is chosen to block only the illuminating light wavelengths, while allowing fluorescent light of any wavelength to pass to the detector. The detector may be an array type so that computer logic can be applied to pass or reject parts.

Preferably the illuminating and fluorescent light wavelengths are both in the near UV. Preferred illuminating wavelengths are 337.5, 356.4 or 408 nm of a Kr$^+$ laser; 351.1 or 383.8 of an Ar$^+$ laser; 325 or 442 nm of a He/Cd laser or 254 or 365 nm of a mercury vapor lamp.

Fluorescent illumination provides an advantage in that one may illuminate with one wavelength and detect at a different wavelength of light. Laser fluorescence more easily distinguishes between resin and inclusions such as metal circuitry which does not fluoresce. If the incident and reflected light have the same wavelength, the only parameter distinguishing portions of the article being seen is the reflectance. Reflectance of metal inclusions may vary depending on the amount of oxide on the surface.

With automated optical inspection, the article to be inspected is illuminated by a light source and the relected light is detected by a camera which can convert the image to a digital format.

U.S. Pat. No. 4,152,723 provides a detailed description of an optical inspection method for circuit boards. A beam of light energy scans, in a predetermined pattern, a surface of the board comprising a pattern of metallic conductors disposed on an insulating substrate. The beam has an energy level high enough to excite detectable fluorescence in the DVS resin. The fluorescence is selectably detected by means sensitive to the wavelength of the fluorescence and is converted to a binary signal which indicates whether the beam is incident on the fluorescing substrate or on the non-fluorescing metallic conductors. The binary signal is then synchronized with the scanning of the beam such that a binary image representation of the board's surface is generated.

Image processing options expand the ability to detect and identify defects in thin films. A digital system may be use to compare a desired image, generated using a CAD image or an actual functioning (golden device) with the device being inspected. The system may be programmed to show only the differences between the two images and to distinguish between the types of defects. Films could be rejected automatically based on the number of areas with too little or too much resin.

With a Fourier transform of the difference between the two images, the type of defect could be identified. For more sensitive processing than differentiation, the Fourier transformed image can be examined for spatial frequencies characteristic of defects. After filtering the transform for defects of interest, an inverse transform would consist of an image of only the defects.

If optical inspection detects defects in the top layer of resin, it may be stripped from the device with an appropriate solvent. This increases ultimate yield of devices. Suitable stripping solvents are those which dissolve the photocured top layer of resin, but do not disturb underlying structures. Suitable stripping solvents include tetrahydrofuran and 2,(3) (tetrahydro-furfuryloxy) tetrahydropyran. A defective photocured DVS resin formulation film may be removed by sonicating it at 75° C. for 20 minutes in a NMP based stripper such as Shipley 1165 stripper. In some cases xylenes may be used as a stripper.

At this point in the process, for example, after passing optical inspection, the patterned thin film may have additional microcircuitry and photodefined dielectric layers applied to it or it can be further thermally cured.

Procedures for preparing multilayer interconnect units or multichip modules are disclosed in the following references which are herein incorporated by reference: J. J. Reche, "Fabrication of High Density Multichip Modules," *IEEE/ CMT* 1989 *IEMT Symposium*, p. 104; T. Tessier et al., "Process Considerations in Fabricating Thin Film MCM's," *IEPS*, 1989, p. 294; S. F. Hahn et al., "The Fabrication and Properties of Thermoset Films Derived from Bisbenzocyclobutene for Multilayer Applications," *Proceedings of the ACS Division of Polymeric Materials: Science and Engineering*, 59, 190, 1988; P. H. Townsend et al., "The Processing and Properties of Multilayer Interconnection Structures Using Thermoset Films Derived From Bisbenzocyclobutene," *Proceedings of the Materials Research Society*, p. 47, 1989; J. Reche et al., "High Density Multichip Module Fabrication," *The International Journal for Hybrid Microelectronics*, Vol. 13, No. 4, 1990. Additional information on preparing multichip modules may be found in "Benzocyclobutene Processing Guide For Multilayer Interconnect Fabrication (Multichip Modules)," The Dow Chemical Company, Midland, Mich., 1991.

After being developed and spun dry, or post-baked, the remaining resin may be cured under a nitrogen atmosphere, using one of the following schedules:

For a soft cured film on which additional metal or polymer layers will be formed, one may heat at 210° C. for 40 minutes.

For a hard or finally cured film, one may heat according to the following schedule:

50° C. for 5 minutes
ramp from 50° C. to 100° C. over 15 minutes
100° C. for 15 minutes
ramp from 100° C. to 150° C. over 15 minutes
150° C. for 60 minutes
ramp from 150° C. to 250° C. over 60 minutes
250° C. for 1 minute
20° C. continuously.

The preferred 10 micron thick film may be fully cured at 250° C. for 60 minutes.

One may also cure the resin film in an infrared belt furnace. A suitable furnace and procedure are disclosed in P. E. Garrou et al., Rapid Thermal Cure of BCB Dielectrics, *Proceedings ECTC*, San Diego, May 1992, pp. 770–776. A Radiant Technology Corporation Model No. LA-306 infrared belt oven may be used with a nitrogen atmosphere. A soft cure may be obtained with a 1.5 minute residence at 260° C. A hard cure may be obtained with a 30 second residence at 280° C.

After curing the individual layers of DVS resin formulation, one may remove any scum remaining in the interconnect vias by exposing the coated substrate to an $O_2/CF_4$ (90/10) plasma at 300 watts, 200 mTorr for 30 seconds. The need for this may vary depending on the size and shape of the vias and the amount of scum remaining.

For making a patterned cured resin film the following is recommended. The exemplified DVS monomer is B-staged at a 25 wt % solid in mesitylene for 46 hours at 165° C. and for sufficient time at 145° C. to obtain a viscosity of 4.4 cp at 145° C. (or 35 cSt at 25° C.) which should be equivalent to an Mw of 140,000 plus or minus 10,000. The DVS resin is concentrated by vacuum stripping to 52 wt % solids (viscosity 4,000 cp at 25° C.). The DVS resin is formulated by adding 2 wt % BAC-M, 0.75 wt % 3,3'-diazidophenyl sulfone and 0.75 wt % AgeRite MA antioxidant and diluting with mesitylene to a viscosity of 1100±50 cSt at 25° C.

This formulation may be spin coated on to $SiO_2$, an underlying partially thermally cured DVS resin formulation or copper on a substrate to form a 10 micron thick, patterned, cured, final film. Spin-coat at 68°–70° F. and 45 to 55 percent relative humidity. Spread for 10 seconds at 500 rpm and spin for 30 seconds at 2800 rpm. Rinse the backside with xylene to prevent formation of cotton candy adhering to the edges of the substrate during spinning.

Prebake at 75° C. for 20 minutes. Photo expose through a mask with a super high pressure mercury arc, I-line (365 nm) at a dose of 300–600 $mJ/cm^2$. Form a puddle of Stoddard's solvent at 68° F. for 2 minutes and then rinse for 20 seconds while spinning at 500 rpm.

Remove residual developing solvent by post baking at 100° C. for 1 minute and then cure. Soft cure at 210° C. for 40 minutes in $N_2$ if you want to add additional layers. Hard cure at 250° C. for 60 minutes in $N_2$ for a final cure. Descum any vias which need it by exposing the coated substrate to an $O_2/CF_4$ (90/10) plasma at 300 watts, 200 mTorr for 30 seconds.

This should yield a 10 micron thick patterned film.

ILLUSTRATIVE EMBODIMENTS

The following examples are given to illustrate the invention and should not be interpreted as limiting it in any way. Unless stated otherwise, all parts and percentages are given by weight. All weight percents stated are relative to the weight of the resin present in the system, excluding the solvent and other additives unless otherwise noted. In examples where a resin is partially polymerized in a solvent, the percent resin solids are based on the weight of resin divided by the weight of resin plus solvent, multiplied by one hundred to obtain percent.

Unless otherwise noted, molecular weights given are apparent molecular weights obtained by size exclusion chromatography using linear polystyrenes as standards. The molecular weights are apparent because the DVS resin is not linear and may have different response sensitivities to the detection means.

Procedure A: Preparation of a Bisbenzocyclobutene Monomer represented by the formula:

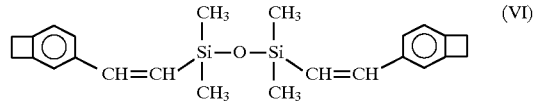

The following reagents are used:

| | |
|---|---|
| 726 g | 3-bromobenzocyclobutene (3.97 mol) |
| 369 g | 1,3-divinyl-1,1,3,3-tetramethyl-disiloxane, (1.98 mol) |
| 1134 g | potassium acetate (11.56 mol) |
| 0.90 g | palladium acetate |
| 4.88 g | tri-(o-tolyl)phosphine |
| 1090 mL | N,N-dimethylformamide |
| 545 mL | deionized water |

Water is charged to the reactor and stirred. Potassium acetate is charged to the reactor and stirred until dissolved. N,N-dimethylformamide is charged to the reactor, followed by 3-bromobenzocyclobutene, 1,3-divinyl-1,1,3,3-tetramethyldisiloxane, palladium acetate and tri-(o-tolyl) phosphine. The resulting mixture is purged with a stream of nitrogen for 30 minutes. The reaction mixture is heated to 93° C. for 25 hours, at which time gas chromatographic analysis indicates that the reaction is complete.

The contents of the reactor are cooled to 60° C. and stirring is stopped. The reaction mixture is diluted with 1000 mL of deionized water. After phase separation has occurred, the water layer is removed and discarded.

The organic layer is diluted with 750 mL of Isopar G® hydrocarbon solvent. The organic phase is washed with 2500-mL portions of deionized water until the aqueous wash is neutral.

The organic phase is stirred during the addition of 2.9 g (0.032 mol) of tert-butyl hydroperoxide. The mixture is stirred at 60° C. for about 4 hours and then cooled to room temperature. A filter is prepared by packing a column of suitable size with 400 g of silica gel and 90 g of magnesium sulfate, on top of a 5 micron filter. The organic solution is passed through the column and the column is washed with 500 mL of Isopar G® hydrocarbon solvent.

The crude product is purified using a short-path distillation apparatus. Two passes are performed. In the first pass, crude product is degassed and Isopar® G hydrocarbon solvent and other volatiles are removed overhead at 110°–130° C. and 4–25 mm Hg. In the second pass, at a temperature of 160° C. and a pressure of 0.001 mm Hg the DVS monomer is removed overhead as the purified product leaving a tar fraction as a bottom stream.

Inorganic impurity content at various points of the purification procedure are:

TABLE I

| Inorganic Specie | Crude ppm | Filtered ppm | Distilled ppm |
|---|---|---|---|
| Br | 159 | 10 | 1.9 |
| Cl | 3 | 7 | 3.3 |
| P | 600 | 100 | <0.3 |
| K |  | <0.3 | <0.3 |
| Na |  | <0.2 | <0.2 |

The distilled product may be sufficiently pure for use in electronic applications without further treatment.

Procedure B: Characterization of DVS Resins by SEC-LALLS

This method determines the Rg, radius of gyration of a DVS resin at an absolute molecular weight of 160,000. The Rg of DVS resins at a given absolute molecular weight, partially polymerized or B-staged at less than 30 wt % solids is lower than a DVS resin that is partially polymerized neat with or without removal of low molecular weight species.

A polystyrene standard is made by dissolving 50 mg of a broad molecular weight atactic general purpose polystyrene (Dow polystyrene 1683) in 25 mL of HPLC grade tetrahydrofuran (THF). A DVS resin concentration standard is made by neat B-staging DVS monomer, dissolving it in mesitylene and precipitating a high molecular weight fraction by adding a non solvent such as butanol. The precipitate is dried in a vacuum. Seventy-five mg of this powder is dissolved in 25 mL of THF. The samples to be tested are usually dissolved in mesitylene. Approximately 30 mg, based on solids, is added to 10 mL THF.

Samples are filtered using syringe type filters prior to testing. For samples with a nominal Mw of less than 100,000, a 25 mm Gelman Acrodisc syringe filter (CR-PTFE), 0.2 micron pores is used. For samples with a nominal Mw of greater than 100,000, a 25 mm Anatop Disposable syringe filter and 0.02 micron pores is used. The smaller filter removes microgels which are present in the higher molecular weight DVS resins. Filtering through 0.02 micron filters is difficult. Considerable force may be needed to filter the higher molecular weight samples and precautions against breakage of the filters should be taken. One may use limited volume inserts in autosampler vials to limit the amount of sample needed.

Nominally, 75 microliters of the samples were injected into 3 Polymer Laboratories PL gel SEC columns connected in series. The first 2 are PL 10 μm Mixed-B columns and the third is a PL 5 μim Mixed-C column. The columns are run at an ambient temperature with a 1 mL/min. flow rate of Fisher HPLC Grade THF sparged continuously with helium for degassing.

Seventy-five μL samples were injected with a Waters WISP 712 autosampler. Low angle laser light scattering is performed with a Chromatix KMX-6 from Thermo-Separations, Inc. at a wavelength of 632.8 nm. The differential refractive index is measured by a Waters 410 Differential Refractive Index detector. The data is collected on an IBM PC using Polymer Laboratories Calibre V5.0 software.

The overall concentration of the DVS resin is calculated by measuring the area under the refractive index detectorpeaks and comparing it with the area under the refractive index detectorpeak of the standard made from dry DVS resin. The LALLS is used to measure the excess Rayleigh factor which is the difference between the Rayleigh factor for the polymer fraction eluting and the Rayleigh factor for the pure solvent. From this and the concentration of the fraction eluting determined by instantaneous refractive index detector, one can calculate the absolute molecular weight for a given retention time for the sample.

Rg for a given retention time can be calculated for the columns by running the same procedure with a known standard. For linear atactic polystyrene such as Dow polystyrene 1683 in THF at 25° C., Rg (in angstroms) is $21.574 + 9.224e{-}4 \times MW - 7.256e{-}10 \times MW^2 + 2.2795e{-}17 \times MW^3$. For the purposes of defining this invention, one correlates retention time with Rg based on the polystyrene standard for the columns. Based on this, one can read off the Rg for the DVS resin sample at 160,000 absolute molecular weight.

Exemplary values for Rg for various DVS resins are set out in TABLE II wherein the Rg is determined for absolute molecular weight of 160,000.

TABLE II

| B-staging Concentration (wt %) | Apparent Mw of Total Sample | Rg (Angstroms) |
|---|---|---|
| *100 | 25,000 | 94 ± 0.7 |
| *100 | 40,600 | 94 ± 1.3 |
| 30 | 126,000 | 83 |
| 25 | 134,000 | 86 |
| 24 | 133,000 | 86 |
| 20 | 119,000 | 86 ± 1.1 |

*Not an example of the invention

Procedure C: Characterization of DVS Resins by DMS

The DVS resins of the invention may also be distinguished from neat B-staged DVS resins by dynamic mechanical spectroscopy. Dynamic mechanical spectroscopy and its use to characterize polymers is generally described in J. D. Ferry, *Viscoelastic Properties of Polymers*, 3rd Ed. Discs of solid resin are cured isothermally at 190° C. The increase of G' and the shear storage modulus, in the rubbery phase is determined. The rate of increase for DVS resins B-staged in a solvent at a concentration of less than 30 percent is lower than the rate for a neat B-staged DVS resin whether the lower molecular weight species are removed or not.

A Rheometrics, Inc. (Piscataway, N.J.) Model RDS-IIE dynamic mechanical spectrometer equipped with a midrange force rebalance transducer and with an environmental chamber for elevated temperature operation or an equivalent may be used. The dynamic shear storage modulus (G') is calculated as the ratio of the in-phase portion of the stress to the strain.

If the DVS resin is in solution, it is vacuum stripped to remove the solvent down to less than 1 percent. Care should be used not to advance the cure of the resin during any vacuum stripping. Discs (8 mm diameter×1.5–2.0 mm thick) are compression molded for 5 minutes at 120° C. and 10–15 psi. The plates of the DMS are heated to the cure temperature (190° C.) and the gap between the plates is zeroed. The oven is opened and the resin disk is loaded onto the bottom plate. The oven is closed and the top plate is lowered into contact with the sample. The plate gap is then adjusted to the original sample thickness minus 0.1 mm to ensure good contact.

The apparatus is started and measurements are taken every 30 seconds. Initially, the strain signal has angular frequency of 10 radians per second and strain amplitude of 10 percent. After 10–11 minutes, the frequency is reduced to 1 radian per second for the duration of the test. Because G' increases by many orders of magnitude during cure, it is also necessary to reduce the strain periodically to keep the torque signal in an acceptable range.

This isothermal cure test yields data for G' as a function of cure time. Since cure temperature is not exactly reproducible, one may calculate the changes in fractional conversion from the time and temperature data.

The change in fractional conversion since the start of the test, denoted by the symbol $\Delta p$, is estimated from the cure test data using equations based on previous studies that have established the effective rate for the pseudo-first-order cure reaction of DVS monomer as set out in R. A. Kirchhoff and K. J. Bruza, "Progress in Polymer Science," Vol. 18, pp. 85–185, 1993. The change in fractional conversion is:

$$\Delta p = p - P_0$$

where $P_0$ and $p$ denote the fractional conversions at the start of the test and at some time into the test, respectively. To estimate the fractional conversion (p) vs. cure time, the following calculation is made for each data point in succession:

$$P_{i+1} = 1 - \{(1-p_i)\exp[-k_{i+1}(t_{i+1}-t_i)]\}$$

where the rate constant is estimated based on:

$$k_{i+1} = (2.79 \times 10^{15} \text{min}^{-1}) \cdot \exp\{-19200/T_{i+1}\}$$

where $T_{i+1}$ is the temperature in °K.

This transformation of cure time to fractional conversion starts from the initial conversion $P_0$ which can be determined by SEC (residual monomer) or DSC (residual exotherm). Typical uncertainties in determining the initial conversion have a negligible effect on the change in fractional conversion.

G' is then plotted against fractional conversion. For B-staged DVS resins G' increases in an approximately exponential fashion from just beyond gellation to a value of about 20 kPa and the value should be most meaningful in this area. The data is fitted to the functional form:

$$G' = A \cdot \exp(a \cdot \Delta p)$$

wherein A is the extrapolated value of G' at the start of the test and the factor a is the slope of the semi-log plot of G' against change in fractional conversion ($\Delta p$). For neat B-staged DVS resins (a) varies from about 500–900. For solvent B-staged DVS resins, wherein the initial monomer concentration is 30 percent or less (a) varies from 230–350. Exemplary values are set out in TABLE III.

TABLE III

| B-staging Concentration (wt %) | Apparent Mw of Total Sample | $p_0$ | a |
|---|---|---|---|
| *100 | 95,000 | .55 | 716 |
| *100 | 95,000 | .55 | 810 |
| *100 | 95,000 | .55 | 739 |
| *100 | 66,000 | — | 694 |
| *100 | 74,000 | .58 | 933 |
| *100 | 43,500 | — | 515 |
| 27 | 161,000 | .50 | 298 |
| 27 | 161,000 | .50 | 352 |
| 27 | 126,000 | .49 | 301 |
| 25 | 161,000 | .50 | 295 |
| 25 | 110,000 | .50 | 322 |
| 20 | 155,000 | .53 | 230 |
| 20 | 103,000 | .52 | 323 |
| 20 | 103,000 | .52 | 314 |

*Not an example of the invention

EXAMPLES 1–10

Partial Polymerization in a Solvent.

A three-necked flask is provided with an agitator, a reflux condenser, thermocouples attached to a temperature controller and a heating mantle operatively connected to the temperature controller. The DVS monomer made by the method set out hereinbefore and mesitylene are added to the flask in the proportions stated wherein percent DVS monomer is the initial weight percent DVS monomer in the total solution.

The agitator is started. The flask is purged with nitrogen and a pad of nitrogen is maintained over the reaction throughout its course. The reaction vessel is then heated to the temperature stated for the time stated. When the reaction is completed, the reactants are either concentrated to 42 percent DVS resin in a rotary evaporator at approximately 90° C. and approximately 50 mm Hg pressure or diluted to 42 percent DVS resin with additional mesitylene.

The Mn and Mw are then measured by size exclusion chromatography (SEC). Results are set out in

TABLE IV

| | Initial Percent Monomer | Polym. Temp. (°C.) | Polym. Time (Hrs) | Mn ×10³ | Mw ×10³ | Mw/Mn |
|---|---|---|---|---|---|---|
| 1* | 5.0 | 167 | 145.8 | 10.0 | 135.0 | 13.5 |
| 2* | 10.0 | 167 | 83.91 | 5.9 | 137.0 | 23.2 |
| 3 | 15.0 | 167–145 | 72.5 | 4.0 | 144.0 | 36.0 |
| 4 | 20.0 | 167–145 | 65.84 | 3.3 | 140.0 | 42.4 |
| 5 | 25.0 | 167–145 | 60.2 | 2.7 | 125.0 | 46.3 |
| 6 | 32.0 | 167–150 | 40.82 | 2.2 | 117.0 | 53.2 |
| 7* | 40.0 | 167–145 | 43.0 | 2.0 | 153.0 | 76.5 |
| 8* | 50.0 | 167–145 | 41.0 | 1.6 | 34.0 | 21.3 |
| 9* | 65.0 | 167 | 23.22 | 1.4 | 24.0 | 17.1 |
| 10* | 100.0 | 167 | 23.0 | 1.3 | 24.0 | 18.5 |

*Not an example of the invention

This data indicates that as the initial concentration of the monomer increases the Mn tends to decrease when the polymerization is continued to a given Mw.

EXAMPLES 11–16

Additional samples are partially polymerized in the same manner at 167° C. until they reach an apparent Mw of 25,000. Weight percent monomer remaining is determined based on total DVS monomer plus oligomer. Results are shown in TABLE V.

TABLE V

| No. | Initial Weight Percent Monomer | Polym. Time (Hrs) | Mn (×10³) | Mw/Mn | Weight Percent Monomer Remaining |
|---|---|---|---|---|---|
| 11* | 5.0 | 100 | 4.5 | 5.6 | 2.0 |
| 12* | 10.0 | 68 | 3.3 | 7.6 | 3.0 |
| 13 | 20.0 | 36 | 2.3 | 10.9 | 6.0 |
| 14 | 30.0 | 28 | 1.7 | 14.7 | 8.0 |
| 15* | 65.0 | 24 | 1.4 | 17.8 | 10.0 |
| 16* | 100.0 | 24 | 1.3 | 19.2 | 12.0 |

*Not an example of the invention

The data indicate that, for a given Mw, the Mn decreases as the initial concentration of monomer in the solvent increases and that this is at least partly because the weight percent monomer remaining is higher. The ratio of Mw/Mn may be called the polydispersity, roughly meaning the breadth of the molecular weight range. The data show that as the initial percent monomer solids in the solvent increases, the polydispersity, or Mw/Mn increases, for a given Mw.

EXAMPLES 17–43

Additional samples are polymerized to different Mw at given initial monomer concentrations.

The DVS resin solution is then diluted to achieve a viscosity of 300 cps, for example. For obtaining thicker films, such as 20 microns, one may use a solution with a viscosity of 800 cps. The solution is filtered through a 5 micron filter in a class 1000 clean room. Three wt %, based on the DVS resin present, 2,6-di(4-azidobenzylidene)4-methylcyclohexanone (BAC-M) is added to the solution of DVS resin.

Bare silicon wafers are plasma oxygen cleaned and dipped in deionized water followed by a spin rinse dry cycle in a rotating spin dryer. The substrate is then coated with a 0.5 percent aqueous solution of 3-aminopropyltriethoxy silane to promote adhesion. The DVS resin solution was then spin coated onto silicon substrates using approximately 3 mL of solution, a spread cycle of 500 rpm for 10 seconds and a spin cycle of 5000 rpm for 30 seconds. The coated wafers are then prebaked in a nitrogen blanketed oven at 80° C. for 30 minutes. The films on the substrates are exposed to 125 to 1000 mJ/cm² of 350–450 nm wavelength light through a quartz photomask in the hard contact mode using an Oriel mask aligner.

The latent image is developed using a development solvent which washes away the unexposed portions of the film. Typical solvents are 2-methoxyethyl ether (diglyme), n-butyl butyrate, Proglyde™ DMM, dipropylene glycol dimethyl ether, or Stoddard solvent. For Examples 24, 26, 27, 31–34, and 36–40, the development solvent is 2-methoxyethyl ether, diglyme. For Examples 25, 28–30, 35, and 41 the development solvent is n-butyl butyrate.

The solvent may be puddled on the coated and exposed substrate followed by spraying additional solvent onto the substrate while spinning at 500 rpm for 30 seconds. Immediately after solvent application is stopped, the spin speed is increased to 4000–5000 rpm for 30 seconds to dry the solvent off. Preferably, diglyme and Proglyde™ DMM solvent are puddled and then spun off. Preferably, n-butyl butyrate is sprayed on during spinning.

The thickness of the films is determined by stylus profilometry. The films are cured by heating them in nitrogen at 250° C. for 1 hour. The thickness of the film is again determined and the ratio of the thickness after hard cure to the thickness prior to solvent development is expressed as percent film retention. Physical changes in the film are also noted. If the film fails as by cracking or crazing, the experiment is terminated. Results are shown in TABLE VI.

TABLE VI

| No. | Initial % Monomer | Mn ×10³ | Mw ×10³ | Weight % Monomer | Weight % Dimer | Percent Film Retention |
|---|---|---|---|---|---|---|
| 17* | 5.0 | 6.1 | 38.0 | | | Cracks |
| 18* | 5.0 | 8.1 | 60.0 | | | Cracks |
| 19* | 5.0 | 9.2 | 88.0 | | | Cracks |
| 20* | 10.0 | 5.9 | 137.0 | 1.7 | 1.9 | Cracks |
| 21* | 10.0 | 5.6 | 102.0 | | | Cracks |
| 22* | 10.0 | 5.1 | 79.0 | | | Cracks |
| 23* | 10.0 | 4.6 | 59.0 | | | Cracks |
| 24 | 12.0 | 3.9 | 57.0 | 3.3 | 2.6 | 76–81 |
| 25 | 12.0 | 4.6 | 108.0 | 2.7 | 2.2 | 74–79 |
| 26 | 15.0 | 3.2 | 53.0 | 4.2 | 3.6 | 57–69 |
| 27 | 15.0 | 3.7 | 97.0 | 3.5 | 3.1 | 77–82 |
| 28 | 15.0 | 3.9 | 109.0 | 3.3 | 3.1 | 72–78 |
| 29 | 15.0 | 4.0 | 144.0 | 3.2 | 2.8 | 78–82 |
| 30 | 15.0 | 4.0 | 197.0 | | | 76–86 |
| 31 | 20.0 | 2.8 | 68.0 | 4.6 | 4.4 | 66–72 |
| 32 | 20.0 | 3.0 | 90.0 | 4.5 | 4.2 | 72–78 |
| 33 | 20.0 | 3.3 | 140.0 | 4.0 | 3.8 | 74–79 |
| 34 | 20.0 | 3.3 | 170.0 | 4.1 | 3.9 | 76–83 |
| 35 | 25.0 | 2.1 | 188.0 | | | 68–74** |
| 36 | 25.0 | 2.7 | 120.0 | 4.9 | 5.2 | 69–75 |
| 37 | 25.0 | 2.6 | 89.0 | 5.1 | 5.4 | 67–76 |
| 38 | 25.0 | 2.1 | 25.0 | | | 45 |
| 39 | 32.0 | 2.2 | 88.0 | 6.0 | 6.7 | 58–66 |
| 40 | 32.0 | 2.2 | 117.0 | 6.3 | 7.2 | 61–70 |
| 41* | 40.0 | 2.0 | 153.0 | | | 60–65 |
| 42* | 100.0 | 1.3 | 25.0 | 12.0 | 9.0 | 40–50 |
| 43* | *** | 4.8 | 95.0 | 1.2 | 2.1 | 85–95 |

*Not an example of the invention
**Poor Film Quality
***Solvent Precipitated Resin This data in TABLE VI indicates that a higher Mw generally gives a higher film retention for the 15, 20, and 25 percent initial monomer concentration. It also shows that outside the range of 12–32 percent initial monomer concentration yields crazing on the low end and poorer film retention on the high end. Resins made with 5 percent initial monomer concentration craze upon evaporation of the solvent after spin coating. Resins made with 10 percent initial monomer concentration craze upon cooling down from softbake.

Thinner films are less prone to crazing. Three to 5 micron films may not crack, even at 12 percent initial monomer concentrations. Films thicker than 10 microns may craze even with 18 percent initial monomer concentration after hot plate baking at 120° C. for 1 minute.

EXAMPLES 44–49

Partial Polymerization at Elevated Temperature and Pressure

A 250 mL glass-lined pressure reactor is used for elevated pressure runs. It is equipped with an agitator, a thermowell with a thermocouple attached to a temperature controller and heating mantle, a gas inlet line for nitrogen blanketing and a vent line.

The stated concentration of monomer in mesitylene is added to the reactor. The agitator is started. The reactor is purged with nitrogen and a pad of nitrogen is maintained over the reaction throughout its course. The reaction vessel is then heated to the temperature stated for the time stated. The nitrogen pressure is maintained above the autogenous pressure of the reactants at the temperature stated to prevent boiling of the reactants.

The Mn and Mw are then measured by size exclusion chromatography (SEC) and the results are stated in TABLE VII.

TABLE VII

| | Initial Percent Monomer | Polym. Temp. (°C.) | Polym. Time (Hrs) | Mn ×10³ | Mw ×10³ |
|---|---|---|---|---|---|
| 44* | 100** | 170 | 20.0 | 1.3 | 42.0 |
| 45 | 25.0 | 183 | 13.5 | 2.0 | 23.0 |
| 46 | 20.0 | 183 | 16 | 3.0 | 91.0 |
| 47 | 15.0 | 183 | 17 | 3.4 | 82.0 |
| 48* | 10.0 | 183 | 26.5 | 5.4 | 89.0 |
| 49* | 5.0 | 184 | 52 | 9.9 | 112.0 |

*Not an example of the invention
**Solvent Precipitated Resin

TABLE VII indicates that the molecular weights achieved at the higher temperature and pressure may be essentially the same as the previous lower temperature examples. Other than shortening the polymerization time, increasing the polymerization temperature does not appear to have a significant impact on the partially polymerized DVS resin.

EXAMPLES 50–70

Polymerization In Other Solvents

Solvents other than mesitylene may be used and precipitation may be used in conjunction with partial polymerization in a solvent.

The same 250 mL glass lined pressure reactor used for Examples 45–49 is used for runs with solvents other than mesitylene.

The stated concentration of monomer in the stated solvent is added to the reactor. The same procedure is used except that as the product solution is cooled, polymer precipitates out. Properties of the various fractions are measured.

The Mn and Mw are then measured by SEC. The results are stated in TABLE VIIIa–c.

TABLE VIIIa

ISOPAR ® G#

| | Initial Percent Monomer | Polym. Temp. (°C.) | Polym. Time (Hrs) | Mn ×10³ | Mw ×10³ |
|---|---|---|---|---|---|
| 50 | 20 | 165 | 41 | 2.0 | 54.0 |
| 51 | 20 | 165 | 41 | 3.6 | 97.0 |
| 52 | 20 | 165 | 41 | 2.9 | 40.0 |

Isopar ® G is a $C_{10}$–$C_{12}$ isoparaffinic hydrocarbon.

Example 50 is the homogenous partially polymerized DVS resin sampled at elevated temperatures, prior to any precipitation. After sitting at room temperature, two layers of polymer precipitate from the solution. Example 51 is the first to form a bottom layer. Example 52 is the second to form a top layer.

EXAMPLES 53–56

TABLE VIIIb n-BUTANOL

| | Initial Percent Monomer | Polym. Temp. (°C.) | Polym. Time (Hrs) | Mn ×10³ | Mw ×10³ |
|---|---|---|---|---|---|
| 53 | 30 | 183 | 11 | 2.0 | 13.0 |
| 54 | 30 | 183–167 | 17.0 | 1.8 | 41.0 |
| 55 | 30 | 183–167 | 17.0 | 2.5 | 42.0 |
| 56 | 30 | 183–167 | 18.5 | 3.1 | 92.0 |

The solution is heated at 183° C. for 11 hours, cooled to 22° C. and the precipitate is sampled as Example 53. The contents of the reactor are heated again to 167° C. for 6 more hours and the homogeneous solution is sampled as Example 54. The reactor is again cooled to 22° C. and the precipitate sampled as Example 55. The reactor is again heated to 167° C. for 1.5 more hours, cooled to 22° C. and the precipitate sampled as Example 56.

Example 54 indicates a lower molecular weight because it is a sample of the homogeneous solution before cooling and precipitation of the insoluble portion.

TABLE VIIIc t-PENTANOL

| | Initial Percent Monomer | Polym. Temp. (°C.) | Polym. Time (Hrs) | Mn ×10³ | Mw ×10³ |
|---|---|---|---|---|---|
| 57 | 60* | 179–152 | 24.65 | 1.6 | 37.0 |
| 57a | 60* | 179–152 | 24.65 | 3.5 | 42.0 |
| 58 | 50* | 183 | 11 | 1.6 | 21.0 |
| 59 | 50* | 183 | 11.3 | 1.5 | 20.0 |
| 60 | 50* | " | " | 2.0 | 22.0 |
| 61 | 50* | 183–167 | 15.0 | 2.1 | 134.0 |
| 62 | 40* | 183–167 | 13.3 | 1.8 | 45.0 |
| 63 | 40* | " | " | 1.9 | 48.0 |
| 64 | 30 | 183 | 13 | 1.9 | 43.0 |
| 65 | 30 | " | " | 2.6 | 50.0 |
| 66 | 30 | 183–167 | 14 | 2.0 | 75.0 |
| 67 | 30 | " | " | 3.0 | 91.0 |
| 68 | 20 | 183 | 15 | 2.3 | 51.0 |
| 69 | 20 | " | " | 4.3 | 69.0 |
| 70 | 20 | " | " | .76 | 1.8 |

*Not an example of the invention

Example 57 is a sample of the homogeneous solution before cooling and precipitation of the insoluble portion. Example 57a is the solid that precipitated from Example 55 solution upon dilution to 20 weight percent oligomer and cooling to 30° C. Example 58 is a sample of the precipitate upon cooling a mixture to 30° C.

Example 59 is a sample of the homogeneous solution before cooling and precipitation of the insoluble portion. Example 60 is the solid that precipitated from Example 59 solution upon cooling to 30° C.

Example 61 is a sample of the solid that precipitated upon cooling the polymerization mixture to 30° C.

Example 62 is a sample of the homogeneous solution before cooling and precipitation of the insoluble portion. Example 63 is the solid that precipitated from Example 62 solution upon cooling to 30° C.

Example 64 is a sample of the homogeneous solution before cooling and precipitation of the insoluble portion. Example 65 is the solid that precipitated from Example 64 solution upon cooling to 30° C.

Example 66 is a sample of the homogeneous solution before cooling and precipitation of the insoluble portion. Example 67 is the solid that precipitated from Example 66 solution upon cooling to 30° C.

Example 68 is a sample of the homogeneous solution before cooling and precipitation of the insoluble portion. Example 69 is the solid that precipitated from Example 68 solution upon cooling to 30° C. Example 70 is a sample of the liquid remaining in the mixture after removal of the precipitate of Example 69.

EXAMPLES 71–73

Forming a Pattern in a Photodefineable DVS Resin Formulation

The exemplified DVS monomer is B-staged at 25 wt % solids in mesitylene for 46 hours at 165° C. and for sufficient time at 145° C. to obtain a viscosity of 4.4 cp at 145° C. (35 cSt at 25° C.) which should be equivalent to an Mw of 140,000 plus or minus 10,000. The DVS resin is concentrated by vacuum stripping to 52 wt % solids (viscosity 4000 cp at 25° C.). The DVS resin is formulated by adding the stated amount of BAC-M, the stated amount of 3,3'-diazidophenyl sulfone and the stated amount of AgeRite MA antioxidant. The solutions are agitated for 2 hours on a Vortex shaker, overnight on an Eberbach shaker and sonicated for 10 minutes to dissolve the additives and remove any air bubbles.

A clean silicon wafer is spin coated with a 0.5 percent aqueous solution of 3-aminopropyltriethoxysilane adhesion promoter at a spin speed of 3,000 rpm for 30 seconds. The photodefineable DVS resin formulation is spin coated on the wafer with a 10 second spread cycle at 500 rpm followed by a 2750 rpm spin for 30 seconds. The wafer is prebaked at 80° C. for 20 minutes. The wafer is placed in a Canon mask aligner and exposed through a quartz photomask for 1,000 mJ/cm$^2$ of light measured at 365 nm using a broad band source of 350–450 nm.

After exposure the films are developed by puddling Stoddard's solvent on the surface of the film while the wafer rests on the vacuum chuck of a Solitec model 5110-ND spray developer. After non photocured resin visibly dissolves the wafers are spun at 500 rpm for 10 seconds while a stream of Stoddard's solvent is directed at the surface. The wafer is spun at 4,000 rpm for 30 seconds to dry. The wafers are post-baked for 10 minutes at 80° C. under N$_2$ to remove residual solvent. The wafer is heated under N$_2$ at 50° C. for 5 minutes, ramped to 100° C. over 5 minutes, heated at 100° C. for 15 minutes, ramped to 150° C. over 15 minutes, heated at 150° C. for 15 minutes, ramped to 250° C. over 60 minutes, heated at 250° C. for 60 minutes and ramped to 100° C. over 120 minutes.

The film thickness is measured after the prebake and after the hard cure. The ratio of the film thickness after hard cure to the thickness after prebake is the film retention, expressed as a percentage. The results are set out in TABLE IX.

Example 71 (5 micron formulation) is formulated with 3.0 wt % BAC-M and 1.0 wt % AgeRite MA. Example 72 (10 micron formulation) is formulated with 2.0 wt % BAC-M, 0.75 wt % 3,3'-diazidophenyl sulfone and 0.75–1.0 wt % AgeRite MA. Example 73 (20 micron formulation) is formulated with 1.0 wt % BAC-M, 0.9 wt % 3,3'-diazidophenyl sulfone and 1.0 wt % AgeRite MA.

TABLE IX

| Example | Prebake Film Thickness (microns) | Post Cure Film Thickness (microns) | Film Retention % |
|---|---|---|---|
| 71 | 8.43 | 7.38 | 87.5 |
| 72 | 12.18 | 10.10 | 82.9 |
| 73 | 22.8 | 18.9 | 82.8 |

Fifty micron vias were opened and clear with each of these formulations. Twenty-five micron vias were opened and clear in the 10 micron and 5 micron thick films.

EXAMPLES 74–82

Forming a Pattern in a Photodefineable DVS Resin Formulation

In the same manner as in Examples 71–73, a pattern is formed and cured. The DVS resins are formulated by addition of the stated amount of bis azide. Results are reported in TABLE X, wherein ISO is 2,2-bis[4-(4-azidophenoxy) phenyl] propane, the ETHER is 4,4'-diazidophenyl ether and the SULF is 4,4'-diazidophenyl sulfide.

TABLE X

| Example | Bis Azide wt % | Prebake Film Thickness (microns) | Post Cure Film Thickness (microns) | Film Retention % |
|---|---|---|---|---|
| 74 | 3.0 SULF | 11.81 | 10.10 | 85.09 |
| 75 | 5.5 SULF | 11.64 | 11.21 | 96.3 |
| 76 | 8.0 SULF | 11.54 | 11.41 | 98.9 |
| 77 | 3.0 ISO | 12.63 | 8.55 | 67.7 |
| 78 | 5.5 ISO | 12.63 | 9.81 | 77.6 |
| 79 | 8.0 ISO | 12.65 | 10.68 | 84.43 |
| 80 | 3.0 ETHER | 12.16 | 9.65 | 79.3 |
| 81 | 5.5 ETHER | 12.07 | 10.61 | 87.9 |
| 82 | 8.0 ETHER | 12.15 | 11.10 | 91.4 |

EXAMPLES 83–85

Forming a Pattern in a Photodefineable DVS Resin Formulation

In the same manner as in Examples 71–73, a pattern is formed and cured. The DVS resins are formulated by addition of the stated amount of bis azides. Results are reported in TABLE XI, wherein ISO is 2,2-bis[4-(4-azidophenoxy) phenyl] propane, the ETHER is 4,4'-diazidophenyl ether and BAC-M is 2,6-bis(4-azidobenzylidene)-4-methylcyclohexanone.

TABLE XI

| Example | Bis Azide wt % | Prebake Film Thickness (microns) | Post Cure Film Thickness (microns) | Film Retention % |
|---|---|---|---|---|
| 83 | 1.5 BAC-M<br>5.0 ETHER | 23.29 | 20.14 | 86.5 |
| 84 | 1.6 BAC-M<br>5.0 ISO | 25.77 | 21.4 | 83.0 |

TABLE XI-continued

| Example | Bis Azide wt % | Prebake Film Thickness (microns) | Post Cure Film Thickness (microns) | Film Retention % |
|---|---|---|---|---|
| 85 | 1.0 BAC-M 5.0 ETHER | 26.62 | 22.89 | 86.0 |

Other benzocyclobutene monomers, for example, those disclosed in U.S. Pat. No. 5,026,892, which is incorporated herein by reference, may be partially polymerized in the presence of a solvent in a similar fashion.

Partial polymerization in the presence of a solvent may be particularly advantageous when a bis benzocyclobutene monomer has a high melting point such as the monomer of the formula:

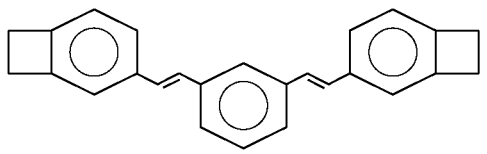

or where the partial polymerization may generate inordinate amounts of heat in a runaway reaction such as a monomer of the formula:

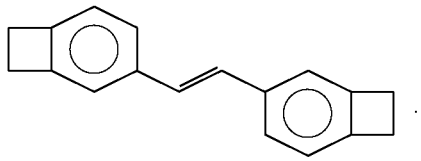

A partially polymerized bis-benzocyclobutene may have a lower melting point because it is a mixture. The solvent may also serve as a heat sink or as a coolant by ebullient cooling for the heat of polymerization.

What is claimed is:

1. A photocurable formulation containing at least one photosensitive agent in an amount sufficient to convert the mixture to an organic-insoluble solid upon exposing the mixture to photon radiation, and a DVS resin:

(1) having a weight average molecular weight of greater than 90,000 g/mole as determined by size exclusion chromatography using narrow molecular weight range linear atactic polystyrene polymers as standards;

(2) being soluble in mesitylene; and (3) being not polymerized beyond its gel point; (4) formed by a process consisting essentially of heating DVS monomer in a solvent at an initial concentration of DVS monomer in the solvent of from about 12 to about 32 weight percent such that the DVS resin:

(a) when applied and polymerized in a ten micron thick layer on a solid substrate does not craze; and (b) when formulated by adding three weight percent 2,6-bis(4-azidobenzylidene)-4-methylcyclohexanone, spun coated onto a substrate, exposed to a photon source to cure at least a portion of the resin formulation beyond its gel point, any unexposed portions of the formulation are removed with a solvent and the photocured resin is finally cured with heat, one obtains a film retention of at least 75 percent.

2. The photocurable formulation of claim 1 containing an aromatic bisazide as a photosensitive agent.

3. The photocurable formulation of claim 2 wherein the initial concentration of DVS monomer in the solvent is from about 20 to about 30 weight percent.

4. The photocurable formulation of claim 3 wherein the initial concentration of DVS monomer in the solvent is 25 percent plus or minus 1 percent.

5. The photocurable formulation of claim 2 wherein the DVS resin has a radius of gyration at an absolute molecular weight of 160,000 of less than 90 Angstroms using SEC/LALLS.

6. The photocurable formulation of claim 2 wherein the DVS resin has the property that if the DVS resin is solvent stripped and subsequently further cured at 190° C., and the rate of increase of the shear storage modulus G' from just beyond gelation is measured, then the exponent describing this rate of increase of G' as a function of change in fractional conversion is 400 or less.

* * * * *